(12) United States Patent
Kim et al.

(10) Patent No.: US 6,856,563 B2
(45) Date of Patent: Feb. 15, 2005

(54) SEMICONDUCTOR MEMORY DEVICE FOR ENHANCING BITLINE PRECHARGE TIME

(75) Inventors: Hyung-Dong Kim, Suwon (KR); Chi-Sung Oh, Seoul (KR)

(73) Assignee: Samsung Electronics Co., Ltd., Kyunggi-do (KR)

( * ) Notice: Subject to any disclaimer, the term of this patent is extended or adjusted under 35 U.S.C. 154(b) by 0 days.

(21) Appl. No.: 10/659,249

(22) Filed: Sep. 11, 2003

(65) Prior Publication Data

US 2004/0076070 A1 Apr. 22, 2004

(30) Foreign Application Priority Data

Oct. 21, 2002 (KR) .............................. 10-2002-0064244

(51) Int. Cl.[7] ................................................ G11C 7/00
(52) U.S. Cl. .................... 365/203; 365/189.08; 365/194
(58) Field of Search ................................ 365/203, 194, 365/189.08

(56) References Cited

U.S. PATENT DOCUMENTS 5,447,498 A * 9/1995 Watson ........................ 602/19
5,623,446 A * 4/1997 Hisada et al. ........... 365/189.11
6,191,988 B1 * 2/2001 DeBrosse .................... 365/205
6,256,246 B1 * 7/2001 Ooishi ......................... 365/205

* cited by examiner

Primary Examiner—Son T. Dinh
(74) Attorney, Agent, or Firm—Harness, Dickey & Pierce P.L.C.

(57) ABSTRACT

A semiconductor memory device for enhancing bitline precharge time and method for accelerating precharge time in the device is provided which may reduce overall precharging time, in an effort to guarantee proper high speed operations in the semiconductor memory device. In the method, an equalization enable signal may be applied to an equalizer of the device to precharge a bitline pair connected a memory cell, isolation part and sense amplifier of the device. Isolation control signals, to be applied to one or more of the isolation parts, may be delayed by a given time, so that a time of applying the isolation control signals is after a time of applying the equalization enable signal to the equalizer.

23 Claims, 4 Drawing Sheets

US 6,856,563 B2

SEMICONDUCTOR MEMORY DEVICE FOR ENHANCING BITLINE PRECHARGE TIME

PRIORITY STATEMENT

This application claims the priority under 35 U.S.C. § 119 from Korean Patent Application No. 2002-64244, which was filed on Oct. 21, 2002, the disclosure of which is incorporated herein, in its entirety, by reference.

BACKGROUND OF THE INVENTION

1. Field of the Invention

The present invention relates to a semiconductor memory device for enhancing a bitline precharge time.

2. Description of the Related Art

A Dynamic Random Access Memory (DRAM) is a type of volatile semiconductor memory device that includes read and write operations. For a read operation in the DRAM, for example, once memory cells, which are connected to the same word line, are selected by a row address applied in the read operation, memory cell data stored in respective memory cells is represented as a weak electric signal through a corresponding bitline (hereinafter, referred to as "B/L"). The memory cell data represented in the B/L is sensed and amplified by a bitline sense amplifier (hereinafter, referred to as "S/A"), and then output over a 'read operation path' via an output buffer to a data output line.

In a write operation, once externally applied write data enters a write buffer, the write data received through the write buffer is passed through a path (opposite to the above-mentioned read operation path) and stored at a memory cell corresponding to an applied row address.

FIG. 1 is a circuit diagram illustrating a conventional art semiconductor memory device. In FIG. 1, memory cells 10 and 11 within a memory cell array and a S/A 40 are connected to each other via bitline pair BL and BLB. The bitline pair is individually coupled with isolation parts 30 and 31 and equalizers 20 and 21. Isolation parts 30 and 31 are substantially identical, thus only isolation part 30 is discussed in further detail for the sake of brevity. Isolation part 30 is composed of isolation transistors NM4 and NM5. The drain-source channels of NM4 and NM5 are each connected to a bitline BL and a complementary bitline BLB of the bitline pair. The gate terminals of NM4 and NM5 receive a common isolation control signal PISOi which electrically isolates memory cell 10 from the S/A 40. If a memory cell (such as memory cell 10) is selected from among a plurality of memory cells, the memory cell 10 is electrically connected to S/A 40 through the bitline pair BL, BLB, and the non-selected memory cell 11 (by application of isolation control signal PISOj, for example) is electrically isolated from the S/A 40.

The semiconductor memory device includes equalizers 20 and 21. Equalizers 20 and 21 are identical, thus only equalizer 20 is discussed in further detail for the sake of brevity. Equalizer 20 is composed of equalization transistors NM1, NM2 and NM3. The drain-source channels of NM1, NM2 and NM3 are individually connected to bitline BL and complementary bitline BLB. Each gate terminal of NM1, NM2 and NM3 receive an equalization control signal PEQi to equally precharge potentials of the bitline BL and complementary bitline BLB. Herewith, a precharge voltage PR can be determined as a half source voltage. The equalization transistors NM1, NM2 and NM3 are disabled in an active mode (such as a read or write operation etc.) and are enabled in a precharge mode. Therefore, once the equalization transistors NM1, NM2 and NM3 are enabled in the precharge mode, the bitline BL and complementary bitline BLB have the same voltage level.

Herewith, once isolation part 30 is driven during an active operation (e.g., read or write operation), a high voltage VPP, at a voltage level greater than an operation source voltage VCC, is applied to gate terminals of the isolation transistors NM4 and NM5. This is done in order to transfer an intact voltage at the high level (VPP) on one of the bitline BL and the complementary bitline BLB to S/A 40 without a drop in a threshold voltage of the transistors NM4 and NM5.

Since a high voltage (VPP) is applied thereto, thickness of the gate oxides of isolation transistors NM4 and NM5 is greater than thickness of gate oxides of transistors in the semiconductor memory device with gate terminals receiving VCC. This greater gate oxide thickness provides protection against a high electric field. In a MOS transistor, as the thickness of the gate oxide increases, the threshold voltage also increases, which reduces a current drive capability of the MOS transistor. Thus, in the precharge mode (e.g., not the active mode), time required to equalize a voltage level of BL and BLB increases by a difficult turn-on operation of the isolation transistors NM4 and NM5.

An explanation follows of why time for the precharge operation in the semiconductor memory device of FIG. 1 is lengthened. Referring to FIG. 1, if operation mode signals PBLSi, PBLSiB and PBLSjB in the precharge mode are individually applied as a low state, high state and high state, an equalization control signal generator 50 generates an equalization control signal PEQi at a high level. Then, a voltage level of respective gate terminals of the equalization transistors NM1, NM2 and NM3 is changed from 0V to VCC, initiating a bitline precharge operation to raise voltage levels toward a level of a half source voltage. Meanwhile, in this precharge mode, application of VPP is removed from the gate terminals of isolation transistors NM4 and NM5, and an internal supply voltage having a relatively low level, e.g., the operation source voltage VCC, is applied thereto.

Additionally in this case, a previously applied ground voltage VSS (not shown in FIG. 1) is removed from the gate terminals of isolation transistors NM6 and NM7 (connected to the non-selected memory cell 11), and the operation source voltage VCC is applied thereto. Since the isolation control signal PISOi is applied at the level of the operation source voltage VCC, an output of a gate NAN1 in an isolation control signal generator 60 responding to operation mode signals PBLSiB and PBLSjB becomes low, and each of P-type MOS transistors PM1, PM2 and PM3 and N-type MOS transistor NM11 of the isolation control signal generator 60 turn-on. In this case, with the bitline pair BL/BLB separated between memory cell 10 and S/A 40, and given that high voltage level data exists on the bitline BL, a bitline BLO3 that is physically closer to memory cell 10 than to S/A 40 is equalized faster than a bitline BLO0 that is closer to the S/A 40 than the memory cell 10. Accordingly, a gate-source voltage difference in isolation transistor NM4 is substantially low, barely exceeding a threshold voltage of the transistor. Thus, an electric potential of the bitline BLO0 adjacent to the S/A 40 is not smartly reduced toward a level of the half source voltage, but instead slowly reduces to the level of the half source voltage.

FIG. 4 illustrates bitline precharge operations of a conventional technology. Referring to FIG. 4, typically an electric potential of the bitline BLO3 reaches the precharge level, and then, after about 0.003 μs, an electric potential of the bitline BL0 reaches the precharge level, as indicated by the long slope of the PISIO curve. Additionally, since the gate oxide of the isolation transistor NM4 is thicker in comparison with other transistors that are connected to VCC, the threshold voltage of isolation transistor NM4 is relatively high and a current drive capability of isolation transistor NM4 is relatively low. As isolation transistor NM4 receives an operation source voltage of about 1.5V in the precharge mode (e.g., instead of receiving a high voltage of about 3V), the gate-source voltage difference is very small. In other words, there is no guarantee of proper turn-on operation for isolation transistor NM4.

That is, if a difference between a voltage of the isolation control signal PISOi and a voltage of the bitline is not sufficiently greater than the threshold voltage of the isolation transistor NM4, current capacity flowing through the isolation transistor NM4 is substantially small, potentially lengthening bitline equalization time.

Conventionally, one of bitline pair BL00 and BLB00 nearest S/A 40 is equalized relatively late, due to the substantially small current drive capabilities of isolation transistors NM4 and NM5. Thus, overall precharge time is increased, potentially adversely affecting high speed operations in the semiconductor memory device.

SUMMARY OF THE INVENTION

Exemplary embodiments of the present invention are directed to a semiconductor memory device for enhancing bitline precharge time and method for accelerating precharge time in the device. The semiconductor memory device may include an isolation part electrically connecting a memory cell to, or isolating the memory cell from, a sense amplifier via a bitline pair. The device may include an equalizer for precharging, in a precharge mode, each bitline of the bitline pair to the same voltage. The device may also include an isolation controller that applies a drive control signal driving the isolation part at a voltage level lower than a specified high voltage level, after lapse of a given time from a precharge starting time point of the equalizer. In the method, an equalization enable signal may be applied to the equalizer to precharge the bitline pair, and isolation control signals, to be applied to one or more isolation parts, may be delayed by the given time, so that a time of applying the isolation control signals is after a time of applying the equalization enable signal to the equalizer.

BRIEF DESCRIPTION OF THE DRAWINGS

Features of the present invention will become readily apparent from the description of exemplary embodiments that follows with reference to the accompanying drawings, in which like reference numerals and symbols designate like elements, in which.

DETAILED DESCRIPTION OF THE EXEMPLARY EMBODIMENTS

Figure 1:
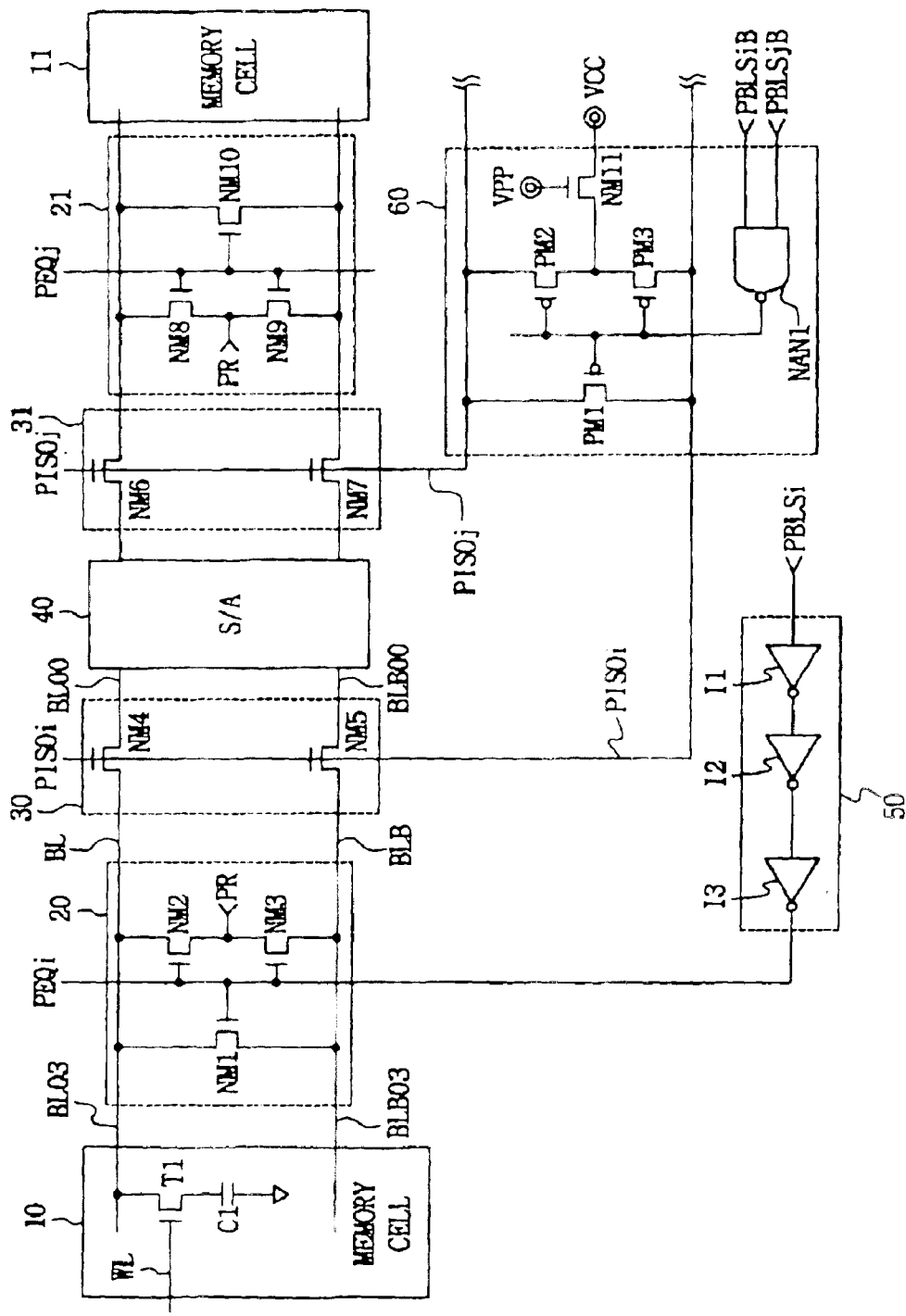
FIG. 1 is a circuit diagram illustrating a conventional art semiconductor memory device.

Hereinafter, exemplary embodiments of the present invention will be described in detail with reference to FIGS. 2 through 5. The elements described in FIGS. 2 through 5 are similar to those described in FIG. 1; therefore a detailed description thereof is generally limited to the differences for the sake of brevity.

Figure 2:
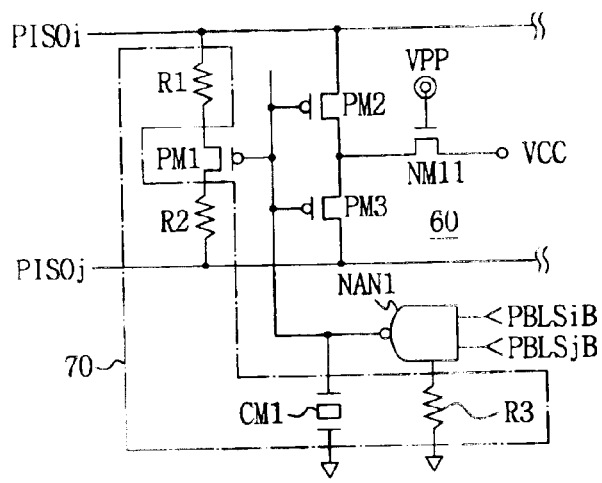
FIG. 2 is a circuit diagram illustrating an isolation controller according to an exemplary embodiment of the present invention.

FIG. 2 is a circuit diagram illustrating an isolation controller according to an exemplary embodiment of the present invention. The semiconductor memory device of FIG. 2, includes an isolation control signal generator 60 similar to the isolation control signal generator 60 shown in FIG. 1 and a control signal delay 70. With memory cell 10 selected, the isolation control signal generator 60 applies, as a high voltage level, an isolation control signal PISOi. In an active mode, isolation control signal PISOi may be configured as a drive control signal to drive the isolation part 30 connected to selected memory cell 10. Isolation control signal generator 60 may also apply an isolation control signal PISOj as a ground voltage level, e.g., 0V, to isolation part 31 connected to non-selected memory cell 11. Isolation control signals PISO1 and PISOj collectively may be occasionally referred to hereafter as a 'drive control signal line pair'. Further, and in a precharge mode, the isolation control signal generator 60 may apply isolation control signals PISOi and PISOj as an internal supply voltage (IVC). The IVC may be lower than a level of the high voltage VPP shown in FIGS. 2 and 3, such as at a level of operation source voltage VCC, to isolation parts 30 and 31.

Isolation control generator 60 includes a NAND gate NAN1 for receiving operation mode signals PBLSiB and PBLSjB to generate a NAND response. The NAND response may be output as an enable signal. Isolation control generator 60 may also include first P-type MOS (PMOS) transistor PM1, second PMOS transistor PM2 and third PMOS transistor PM3. Collectively, (i.e., in common), PMOS transistors PM1, PM2 and PM3 may equalize the drive control signal line pair (PISOi, PISOj) to VCC, in response to a first state (a logic low) of the enable signal. PMOS transistors PM1, PM2 and PM3 may also respond, in common, to a second state (logic high) of the enable signal, so that the drive control signal line pair (PISOi and PISOj) has a level difference of the high voltage (VPP). Isolation control generator 60 may also include an N-type MOS transistor NM11 connected to a common access node of the second and third PMOS transistors PM2 and PM3 to supply VCC.

According to an exemplary embodiment of the present invention, the control signal delay 70 may apply isolation control signals PISOi, PISOj after a lapse of a 'given time' from a precharge starting time point of the equalizer 20 (or 21). As discussed previously, in the precharge mode, the isolation control signals PISOi, PISOj are applied to the isolation parts 30, 31 at a level of the internal supply voltage (i.e.,VCC) that is less than the high voltage level VPP. In FIG. 2, the control signal delay 70 may include resistors R1, R2. As shown in FIG. 2, resistors R1 and R2 may be individually connected to a source and drain of the first PMOS transistor PM1. Control signal delay 70 may also include an RC delay that composed of resistor R3 and MOS capacitor CM1. The given time may be determined by the RC delay and resistors R1, R2.

The exemplary embodiments briefly described above and to be more fully described hereafter, may substantially guarantee a turn-on operation for isolation transistors NM4 and NM5 in the precharge mode. Accordingly, since precharging time is reduced, time to equalize voltage levels of a bitline BL and a complementary bitline BLB to a half source voltage (i.e., ½ VCC) may also be substantially reduced, as described in further detail hereafter.

In the precharge mode, as operation mode signals PBLSi, PBLSiB and PBLSjB are each applied as a low state, high state and high state, respectively, the equalization control signal generator 50 generates an equalization control signal PEQi at a high level. To this end, a voltage level at each respective gate terminal of equalization transistors NM1, NM2 and NM3 is changed from 0V to VCC, to initiate a bitline precharge operation for targeting a level of the half source voltage. Meanwhile, at initial operation of the precharge mode, a voltage slightly lower than high voltage VPP, but higher than VCC, is applied to gate terminals of the isolation transistors NM4 and NM5, instead of VCC. This 'voltage slightly lower than VPP' is obtained based on an operational role of the control signal delay 70.

In other words, the isolation control signal PISOi is not immediately applied at the level of operation source voltage VCC because the output of NAN1 (responding to operation mode signals (PBLSiB, PBLSjB) is delayed due to the RC delay, and because a time at which drive control signal line pair (PISOi, PISOj) is equalized to VCC is also delayed, due to resistors R1 and R2. Accordingly, in a case where high level data exists on the bitline BL, equalization speed between bitline BL03 and bitline BL00 is essentially the same, due to the substantially larger current drive capability of the isolation transistor NM4. The current capability of the transistor NM4 increases because a voltage difference between the gate and source of the isolation transistor NM4 rises, so that the voltage difference substantially exceeds the threshold voltage of the transistor. This is because a voltage slightly lower than VPP, instead of VCC, has been applied to the gate of the isolation transistor NM4, due to the role of control signal delay 70.

Figure 5:
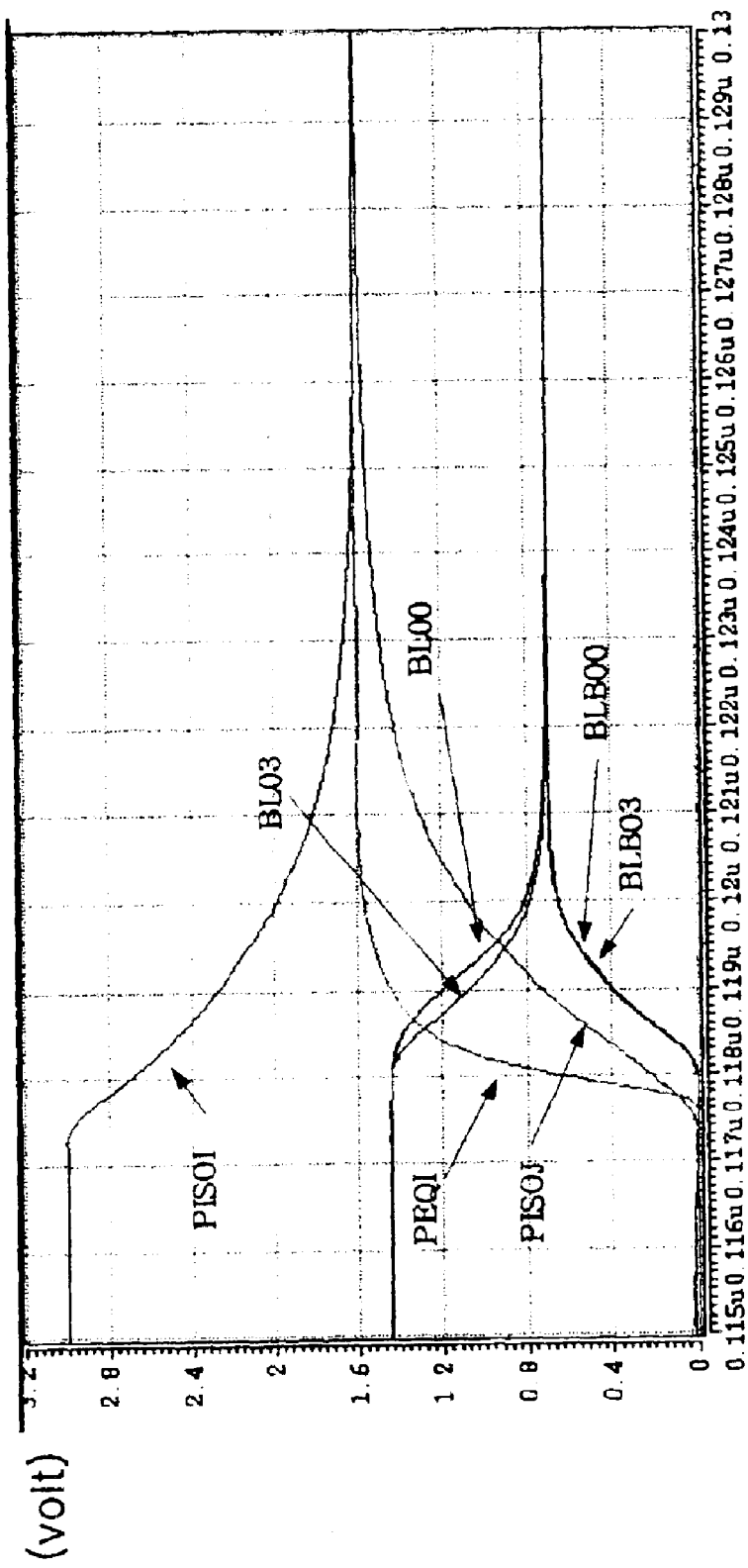
FIG. 5 illustrates bitline precharge operations in accordance with an exemplary embodiment of the present invention.

FIG. 5 illustrates bitline precharge operations in accordance with an exemplary embodiment of the present invention. As current drive capability of the isolation transistor NM4 increases, an electric potential of the bitline BL00 adjacent to the S/A 40 may be swiftly reduced to a level of the half source voltage, as the precharge level. As shown in FIG. 5, a time point when an electric potential of the bitline BL03 reaches the precharge level, and a time point when an electric potential of the bitline BL00 reaches the precharge level, are almost identical, thus substantially reducing precharging time.

As described above, a time at which the isolation control signal is applied, which is changed to a level of the internal supply voltage, may be delayed in the precharge mode. Thus, one bitline from the bitline pair BL00, BLB00 adjacent to the S/A 40 may be quickly precharged, in an effort to substantially guarantee high speed operation of the semiconductor memory device.

Figure 3:
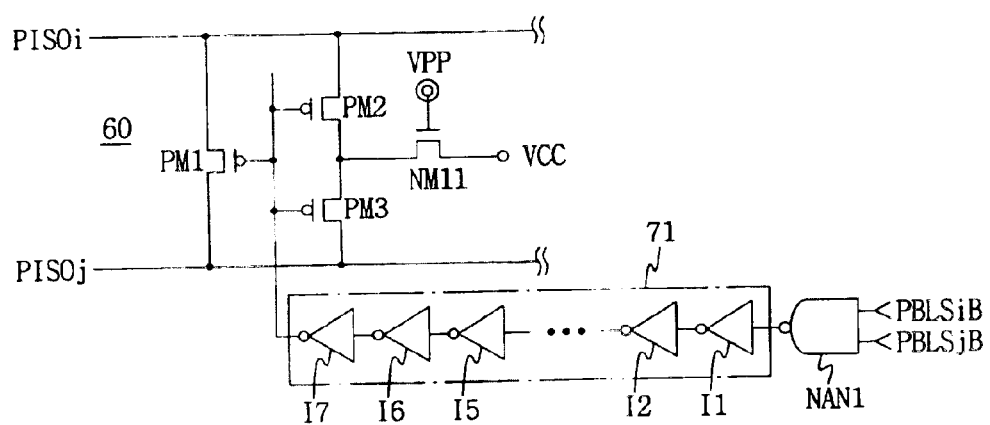
FIG. 3 is a circuit diagram illustrating an isolation controller according to another exemplary embodiment of the present invention

FIG. 3 is a circuit diagram illustrating an isolation controller according to another exemplary embodiment of the present invention. Referring to FIG. 3 the isolation control signal generator 60 has essentially identical construction as in FIG. 2, but includes a control signal delay 71. Control delay 71 may be composed of an inverter chain, although operational principles of the isolation control signal generator 60 may be substantially identical to that described with respect to FIG. 2.

The control signal delay 71 performs the same functions as the control signal delay 70 of FIG. 2, with a delay operation being performed by the inverter chain. That is, a time at which an equalization is performed in isolation control signal generator 60 is later than a time at which the equalization control signal PEQi is applied. Thus, turn-on operations for isolation transistors NM4, NM5 may be sufficiently guaranteed so as to substantially reduce time needed to equalize voltages of bitline BL and complementary bitline BLB to the half source voltage (½ VCC).

As discussed above, FIG. 4 illustrates bitline precharge operations of a conventional technology, and FIG. 5 illustrates bitline precharge operations. in accordance with an exemplary embodiment of the present invention. These figures provide a comparison to illustrate the reduced precharging time, and hence swifter time to equalization, that may be realized by the exemplary embodiments of the present invention.

Figure 4:
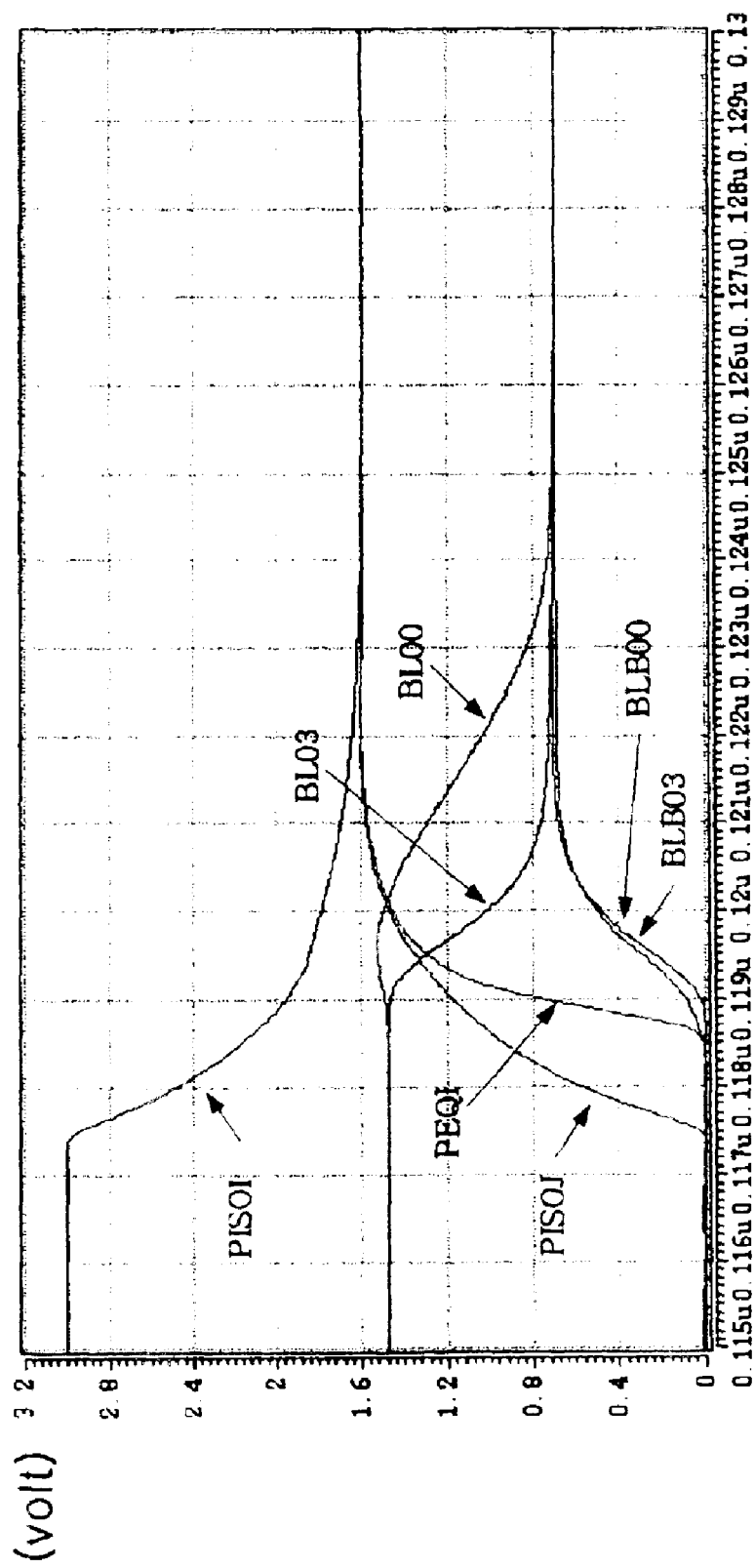
FIG. 4 illustrates bitline precharge operations of a conventional technology.

Referring to FIG. 4, a bitline BL00 adjacent to the S/A 40 is equalized to the half source voltage (about 0.7V), at a time that is later (by about 3 $\mu$s) than a time at which a bitline BL03 adjacent to memory cell 10 is equalized. Due to this offset equalization time, the voltage difference between gate and source voltage of the isolation transistor NM4 does not greatly exceed a threshold voltage in the precharge mode. In other words, the value of the difference voltage is barely discernable from the threshold voltage of the isolation transistor NM4. The isolation transistor NM4 is thus turned on slightly, i.e., the transistor may cycle between on, off, etc. depending on the value of the voltage difference as compared to the threshold voltage of the isolation transistor NM4.

Referring to FIG. 5, a slope of the graph indicates that the isolation control signal (PISOI curve) decays at a relatively slow rate. That is, the time to reduce from a level of the high voltage (VPP, about 3.0V), toward a level of the internal supply voltage (VCC, about 1.6V) is long in comparison with the slope of the PISOI curve in FIG. 4. This results from an operation of the control signal delay 70. Therefore, a time at which an electric potential of the bitline BL03 reaches a precharge level is essentially the same as the time point at which an electric potential of the bitline BL00 reaches the precharge level, as shown in FIG. 5. This may substantially reduce the precharging time; a comparison between FIGS. 4 and 5 illustrate that precharging time (or time to equalization) may be reduced by at least 0.003 $\mu$s.

In accordance with the exemplary embodiments of the present invention, a current drive capability of the isolation transistor NM4 may be provided largely at an initial operation (i.e., initialization) of the precharge mode. Thus, a common problem, in which one bitline of a bitline pair BL00, BLB00, for example, that is nearest the S/A 40 is equalized relatively late, may be avoided. This is because overall precharging time as been reduced, which may substantially guarantee proper high speed operations in a semiconductor memory device. Since the current capability of the isolation transistor increases in the precharge mode of a semiconductor memory device, bitline equalization time may also be reduced so as to perform a precharge operation at high speed.

The exemplary embodiments of the present invention being thus described, it will be obvious that the same may be varied in many ways. Such variations are not to be regarded as a departure and scope of the exemplary embodiments of the present invention, and all such modifications as would be obvious to one skilled in the art are intended to be included within the scope of the following claims.

What is claimed is:

1. A semiconductor memory device, comprising:

an isolation controller applying a drive control signal for driving an isolation part at a internal supply voltage level lower than a specified high voltage level, after lapse of a given time from a precharge starting time point of an equalizer.

2. The device of claim 1, wherein the lapse of given time occurs while the equalizer is in a precharge mode.

3. The device of claim 1, wherein the isolation controller includes:

an isolation control signal generator applying the drive control signal to the isolation part; and a control signal delay delaying the drive control signal for lapse of the given time.

4. The device of claim 3, wherein in an active mode, the drive control signal is applied as a high voltage level to an isolation part connected to a selected memory cell, and is applied as a ground voltage level to an isolation part connected to a non-selected memory cell, and in a precharge mode, the drive control signal is applied at the internal supply voltage level to isolation parts connected to the selected and non-selected memory cells.

5. The device of claim 3, wherein the control signal delay includes at least one of an RC delay and an inverter chain.

6. The device of claim 1, wherein the isolation part includes at least a pair of N-type MOS transistors, each having a threshold voltage higher than transistors receiving the internal supply voltage level through a gate thereof.

7. The device of claim 3, wherein the isolation control signal generator includes:

a NAND gate receiving operation mode signals to generate a NAND response for output as an enable signal;

a plurality of P-type MOS transistors equalizing a drive control signal line pair in response to a first state of the enable signal, and enabling a high voltage level difference between signal lines of the drive control signal line pair in response to a second state of the enable signal; and an N-type MOS transistor connected to a common access node of at least one of the plurality of P-type MOS transistors, for supplying the internal supply voltage level.

8. A semiconductor memory device, comprising:

a memory cell array configured as a plurality of memory cell blocks of memory cells, the memory cells connected to one another at points crossed between a plurality of word lines and a plurality of bitlines;

a sense amplifier connected to the memory cells via a bitline pair;

an isolation part connected to the bitline pair for electrically connecting a memory cell to, or isolating the memory cell from, the sense amplifier; an equalizer connected to the bitline pair between the isolation part and a memory cell block for precharging, in a precharge mode, each bitline of the bitline pair to the same voltage; an isolation control signal generator applying an isolation control signal to the isolation part; and a control signal delay delaying the isolation control signal for a given time from a precharge starting time point of the equalizer, the isolation control signal generator applying the isolation control signal at an internal supply voltage level that is lower than a specified high voltage level.

9. The device of claim 8, wherein, in the precharge mode, the isolation control signal is applied as the internal supply voltage level to at least one isolation part individually connected to one or more memory cell blocks.

10. The device of claim 8, wherein in an active mode, the isolation control signal is applied as a high voltage level to an isolation part connected to a selected memory cell, and is applied as a ground voltage level to an isolation part connected to a non-selected memory cell, and in the precharge mode, the isolation control signal is applied as the internal supply voltage level to isolation parts connected to the selected and non-selected memory cells.

11. The device of claim 8, wherein the control signal delay includes at least one of an RC delay and an inverter chain.

12. The device of claim 8, wherein the isolation control signal generator includes:

a NAND gate for receiving operation mode signals to generate an enable signal at an output thereof;

first, second and third P-type MOS transistors equalizing an isolation control signal line pair in response to a first state of the enable signal, and enabling a high voltage level difference between signal lines of the drive control signal line pair in response to a second state of the enable signal; and an N-type MOS transistor connected to a common access node of the second and third P-type MOS transistors, for supplying the internal supply voltage.

13. The device of claim 12, wherein the control signal delay includes an RC delay connected to the NAND gate, and at least two resistors, each connected to a source and a drain of the first P-type MOS transistor.

14. The device of claim 12, wherein the control signal delay includes an inverter chain of even-numbered terminals connected to the NAND gate output.

15. The device of claim 8, wherein the memory cells are configured in a matrix structure.

16. The device of claim 8, wherein a memory cell is connected to, or isolated from, the sense amplifier based on a state of the isolation control signal applied thereto; and the equalizer precharges the bitlines in response to a state of an equalization control signal applied thereto.

17. A method of accelerating a precharge time in a semiconductor memory device, comprising:

applying an equalization enable signal to an equalizer at initiation of a precharge mode to precharge a bitline pair connecting a memory cell block to a sense amplifier; and delaying isolation control signals by a given time in the precharge mode, and applying the isolation control signals to isolation parts adapted to connect the memory cell block to or isolate the memory cell block from the sense amplifier, so that a time of applying the isolation control signals is after a time of applying the equalization enable signal.

18. The method of claim 17, wherein, in the precharge mode, an isolation control signal applied to an isolation part connected to a selected memory cell block, and an isolation control signal applied to an isolation part connected to a non-selected memory cell block are applied at the same internal supply voltage level.

19. The method of claim 18, wherein, in an active mode the isolation control signal applied to the isolation part connected to the selected memory cell block is at a high voltage level, and the isolation control signal applied to the isolation part connected to the non-selected memory cell block is at a ground voltage level.

20. A memory device having an isolation part electrically connecting a memory cell to, or isolating the memory cell from, a sense amplifier via a bitline pair, the device including an equalizer for precharging, in a precharge mode, each bitline of the bitline pair to the same voltage, comprising:

an isolation controller for applying, during the precharge mode, a voltage at a level substantially similar to a specified high voltage level to a gate of an isolation transistor of the isolation part that is connected to at least one bitline of the bitline pair, and for applying an internal supply voltage at a level lower than the specified high voltage level during the precharge mode.

21. The device of claim 20, wherein the voltage substantially similar to a specified high voltage level is applied earlier in time during the precharge mode than the applied internal supply voltage.

22. A semiconductor memory device accelerating a precharge time therein in accordance with the method of claim 17.

23. A memory device having an isolation part electrically connecting a memory cell to, or isolating the memory cell from, a sense amplifier via a bitline pair, the device including an equalizer for precharging, in a precharge mode, each bitline of the bitline pair to the same voltage, the memory device accelerating a precharge time therein in accordance with the method of claim 17.

* * * * *